United States Patent
Zhang et al.

(10) Patent No.: US 9,525,401 B2
(45) Date of Patent: Dec. 20, 2016

(54) LOW CLOCKING POWER FLIP-FLOP

(71) Applicant: NVIDIA Corporation, Santa Clara, CA (US)

(72) Inventors: Xi Zhang, San Jose, CA (US); Hwong-Kwo Lin, Palo Alto, CA (US); Ge Yang, Dublin, CA (US); Lingfei Deng, Santa Clara, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 14/644,637

(22) Filed: Mar. 11, 2015

(65) Prior Publication Data

US 2016/0269002 A1  Sep. 15, 2016

(51) Int. Cl.
 *H03K 3/00* (2006.01)
 *H03K 3/012* (2006.01)
 *H03K 3/037* (2006.01)
 *H03K 19/21* (2006.01)

(52) U.S. Cl.
 CPC ............ *H03K 3/012* (2013.01); *H03K 3/0372* (2013.01); *H03K 19/21* (2013.01)

(58) Field of Classification Search
 CPC ... H03K 3/037; H03K 3/012; H03K 3/356121
 USPC ..... 327/218, 202, 199, 211, 198; 326/46, 93
 See application file for complete search history.

(56) References Cited

U.S. PATENT DOCUMENTS

| | | | |
|---|---|---|---|
| 4,256,411 A | 3/1981 | Podosek | |
| 5,821,791 A | 10/1998 | Gaibotti et al. | |
| 5,903,171 A | 5/1999 | Shieh | |
| 6,310,501 B1 | 10/2001 | Yamashita | |
| 6,396,309 B1 | 5/2002 | Zhao et al. | |
| 6,442,721 B2 | 8/2002 | Whetsel | |
| 6,472,920 B1 | 10/2002 | Cho et al. | |
| 6,580,411 B1 | 6/2003 | Kubota et al. | |
| 6,630,853 B1 * | 10/2003 | Hamada | H03K 3/012 327/202 |
| 6,714,060 B2 | 3/2004 | Araki | |
| 6,747,485 B1 | 6/2004 | Suryanarayana et al. | |
| 7,057,421 B2 | 6/2006 | Shi et al. | |
| 7,196,552 B2 | 3/2007 | Zhou | |
| 7,304,903 B2 | 12/2007 | Mukhopadhyay et al. | |
| 7,405,606 B2 * | 7/2008 | Kok | H03K 3/012 326/95 |
| 7,418,641 B2 | 8/2008 | Drake et al. | |
| 7,760,117 B1 | 7/2010 | Chou | |
| 8,742,796 B2 | 6/2014 | Dally et al. | |
| 2004/0160244 A1 | 8/2004 | Kim | |
| 2004/0243896 A1 | 12/2004 | Jaber et al. | |
| 2005/0040856 A1 | 2/2005 | Ramaraju et al. | |

(Continued)

FOREIGN PATENT DOCUMENTS

JP  2004214997  7/2004

*Primary Examiner* — Lincoln Donovan
*Assistant Examiner* — Thomas Skibinski

(57) ABSTRACT

Low clocking power flip-flop. In accordance with a first embodiment of the present invention, a flip-flop electronic circuit includes a master latch coupled to a slave latch in a flip-flop configuration. The flip-flop electronic circuit also includes a clock control circuit for comparing an input to the master latch with an output of the slave latch, and responsive to the comparing, blocking a clock signal to the master latch and the slave latch when the flip-flop electronic circuit is in a quiescent condition.

20 Claims, 2 Drawing Sheets

(56) References Cited

U.S. PATENT DOCUMENTS

| | | |
|---|---|---|
| 2005/0108604 A1 | 5/2005 | Wong |
| 2006/0049852 A1 | 3/2006 | Park et al. |
| 2007/0028157 A1 | 2/2007 | Drake et al. |
| 2007/0146033 A1* | 6/2007 | Pesci ............... H03K 3/356156 327/218 |
| 2008/0086667 A1 | 4/2008 | Chen et al. |
| 2008/0195337 A1 | 8/2008 | Agarwal et al. |
| 2008/0270862 A1 | 10/2008 | Drake et al. |
| 2010/0102890 A1 | 4/2010 | Stratz et al. |
| 2010/0109707 A1* | 5/2010 | Srivastava ............... G06F 1/04 326/93 |
| 2010/0332924 A1 | 12/2010 | Ziaja et al. |
| 2011/0066904 A1 | 3/2011 | Lackey |

* cited by examiner

LOW CLOCKING POWER FLIP-FLOP

FIELD OF INVENTION

Embodiments of the present invention relate to the field of integrated circuit design and manufacture. More specifically, embodiments of the present invention relate to systems and methods for low clocking power flip-flops.

BACKGROUND

The term "flop," or "flip-flop," is generally used to describe or to refer to a clocked electronic circuit having two stable states, which is used to store a value. A flop generally comprises two latch circuits. Flip-flops have many and varied applications, and are widely used in digital circuits. One important use of flip-flops is to store bits of an instruction within an instruction pipeline of a central processing unit (CPU) or graphical processing unit (GPU).

In a conventional flip-flop electronic circuit, data is stored in cross-coupled inverters. A first, or "master" latch comprises a pass or transmission gate and a cross-coupled inverter. A second, or "slave" latch similarly comprises a pass gate and a cross-coupled inverter. A clock signal controls the operation of the two pass gates, and hence the operation of the flip-flop circuit.

Unfortunately, most flip-flops have a relatively low usage rate or duty cycle. For example, a given flip-flop may only change state on about ten percent or less of clock cycles. As numerous devices, e.g., portions of gates, including pass gates, receive such clock signals in a conventional flip-flop circuit, such devices dissipate clocking power with every clock signal transition. For complementary metal oxide semiconductors (CMOS) circuits, dynamic, or active power is given approximately by $p=CV^2f$, where C is the active switching capacitance, V is the supply voltage, and f is the frequency of operation. All devices, e.g., field effect transistors (FETs), that receive a clock signal dissipate dynamic power due to the switching capacitance of the device. The total dynamic power due to clocking is proportional to the total switching capacitance. Since the flip-flop may be inactive for 90 percent or more of clock cycles, such clocking power consumed while the flip-flop is otherwise quiescent is unproductive, and wasted.

Such deleterious dissipation of active power due to quiescent clocking has many undesirable effects, including, for example, increasing total power consumption, which may decrease battery life, and increasing a temperature of an integrated circuit, which may require costly increased heat mitigation structures and techniques, e.g., heat sinks, and/or decrease reliability of the integrated circuit.

SUMMARY OF THE INVENTION

Accordingly, it would be beneficial to reduce the number of gates of a flip-flop electronic circuit receiving a clock signal during quiescent periods in order to reduce the switching gate capacitance, reduce clocking power, and thereby reduce total power consumption of a flip-flop electronic circuit.

Therefore, what is needed are systems and methods for low clocking power flip-flops. What is additionally needed are systems and methods for low clocking power flip-flops that block a clock signal to a flip-flop's latches during periods of inactivity. A further need exists for systems and methods for low clocking power flip-flops that are compatible and complementary with existing systems and methods of integrated circuit design, manufacturing and test. Embodiments of the present invention provide these advantages.

In accordance with a first embodiment of the present invention, a flip-flop electronic circuit includes a master latch coupled to a slave latch in a flip-flop configuration. The flip-flop electronic circuit also includes a clock control circuit for comparing an input to the master latch with an output of the slave latch, and responsive to the comparing, blocking a clock signal to the master latch and the slave latch when the flip-flop electronic circuit is in a quiescent condition.

In accordance with a method embodiment of the present invention, a data input to a master latch electronic circuit is compared with a data output of a slave latch electronic circuit. The master latch electronic circuit and the slave latch electronic circuit are configured to form a flip-flop electronic circuit. Responsive to the comparing, a clock signal to the master latch electronic circuit and the slave latch electronic circuit is blocked when the flip-flop electronic circuit is in a quiescent condition.

In another embodiment of the present invention, an electronic circuit includes a master latch, a slave latch and a clock control circuit. The master latch includes a first pass gate coupled to an input of a first inverter and a second tri-state inverter coupled to an output of the first inverter and to the input of the first inverter. The first pass gate and the second tri-state inverter are controlled by a first clock signal and its inverse. The slave latch includes a second pass gate (coupled to an input of a third inverter and a fourth tri-state inverter coupled to an output of the third inverter and to the input of the third inverter. The second pass gate and the fourth tri-state inverter are controlled by a second clock signal and its inverse. The master latch and the slave latch are configured to form a flip-flop electronic circuit. The clock control circuit is configured for comparing an input to the master latch and an output of the slave latch, and responsive to the comparing, presenting a quiescent master latch clock signal to the master latch and a quiescent slave latch clock signal to the slave latch.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Reference will now be made in detail to various embodiments of the invention, low clocking power flip-flop, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Low Clocking Power Flip-Flop

Figure 1:
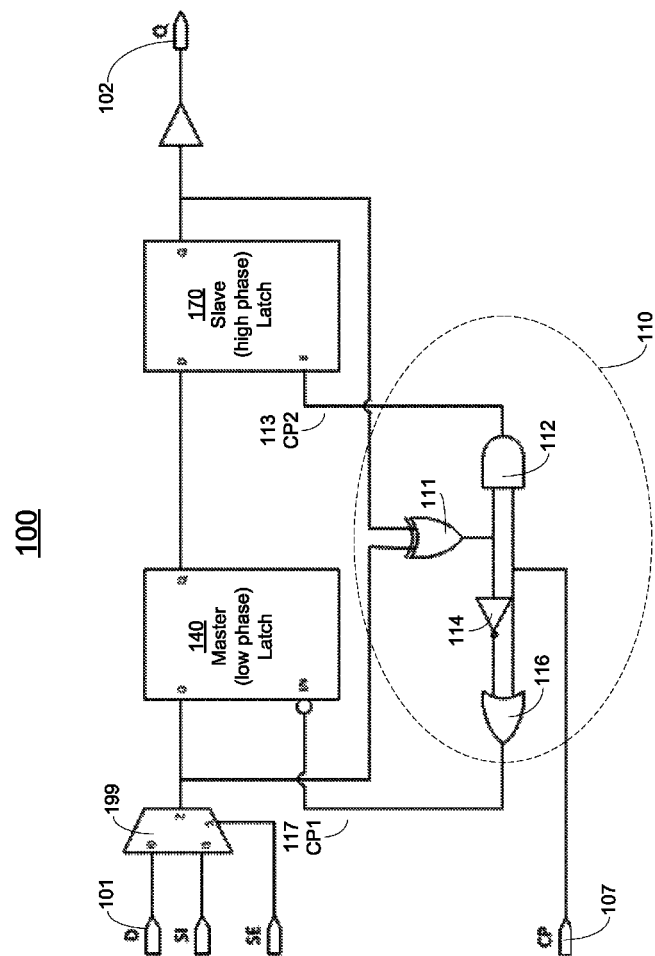
FIG. 1 illustrates an exemplary block diagram of a low clocking power flip-flop electronic circuit, in accordance with embodiments of the present invention.

FIG. 1 illustrates an exemplary block diagram of a low clocking power flip-flop electronic circuit 100, in accordance with embodiments of the present invention. Low clocking power flip-flop electronic circuit 100 comprises two conventional latches, master latch 140 and slave latch 170. In this exemplary embodiment, master latch 140 and slave latch 170 are D-Q type latches, although that is not required. Embodiments in accordance with the present invention are well suited to a variety of latch types. Low clocking power flip-flop electronic circuit 100 additionally comprises an optional scan multiplexor 199. Responsive to a scan enable input SE, scan multiplexor 199 selects between a scan input SI, e.g., for test purposes, or a data input D 101.

Low clocking power flip-flop electronic circuit 100 further comprises an internal clock control circuit 110. Clock control circuit 110 determines if the flip-flop electronic circuit 100 is active, by comparing the input to the master latch 140 with the output of the slave latch 170. If the flip-flop electronic circuit 100 is active, clock control circuit 110 allows the clock signal CP 107 to propagate to the master latch 140 and to the slave latch 170, enabling "nominal" operation of the flip-flop electronic circuit 100. However, if the flip-flop electronic circuit 100 is inactive, e.g., the new data input is equal to the stored data, clock control circuit 110 blocks the clock signal CP 107 from the master latch 140 and from the slave latch 170. When the clock signal CP 107 is blocked, the flip-flop electronic circuit 100 does not change state.

It is to be appreciated that clock control circuit 110 is internal to low clocking power flip-flop electronic circuit 100. For example, clock control circuit 110 accepts inputs only from low clocking power flip-flop electronic circuit 100, and controls clock signals only to low clocking power flip-flop electronic circuit 100. Additionally, clock control circuit 110 does not accept input from, nor provide control to, devices outside of low clocking power flip-flop electronic circuit 100.

Clock control circuit 110 implements the following logic expressions:

For the master latch, 117 CP1=($D_{140}$ XNOR $Q_{170}$)
OR CP 107     (Relation 1)

For the slave latch, 113 CP2=($D_{140}$ XOR $Q_{170}$)
AND CP107     (Relation 2)

It is to be appreciated that when the clock signal CP 107 is blocked, for example, when the content of master latch 140 equals the content of slave latch 170, e.g., not generated, no elements of flip-flop electronic circuit 100 receive a clock signal, besides NAND gate 112 and NOR gate 116 of clock control circuit 110. For example, no elements of master latch 140, and no elements of slave latch 170 receive a clock signal. Accordingly, no elements of master latch 140 or slave latch 170 are clocked, and no elements of master latch 140 or slave latch 170 consume active clocking power. Thus, active power, e.g., power related to clocked inputs, is advantageously reduced when the flip-flop electronic circuit 100 is inactive or quiescent.

In contrast, under the conventional art, a clock signal e.g., a free running clock signal, is distributed to all clocked elements of a conventional flip-flop. Such elements continue to be clocked, and consume active power related to the active clock signal, even when the conventional flip-flop is quiescent.

Figure 2:
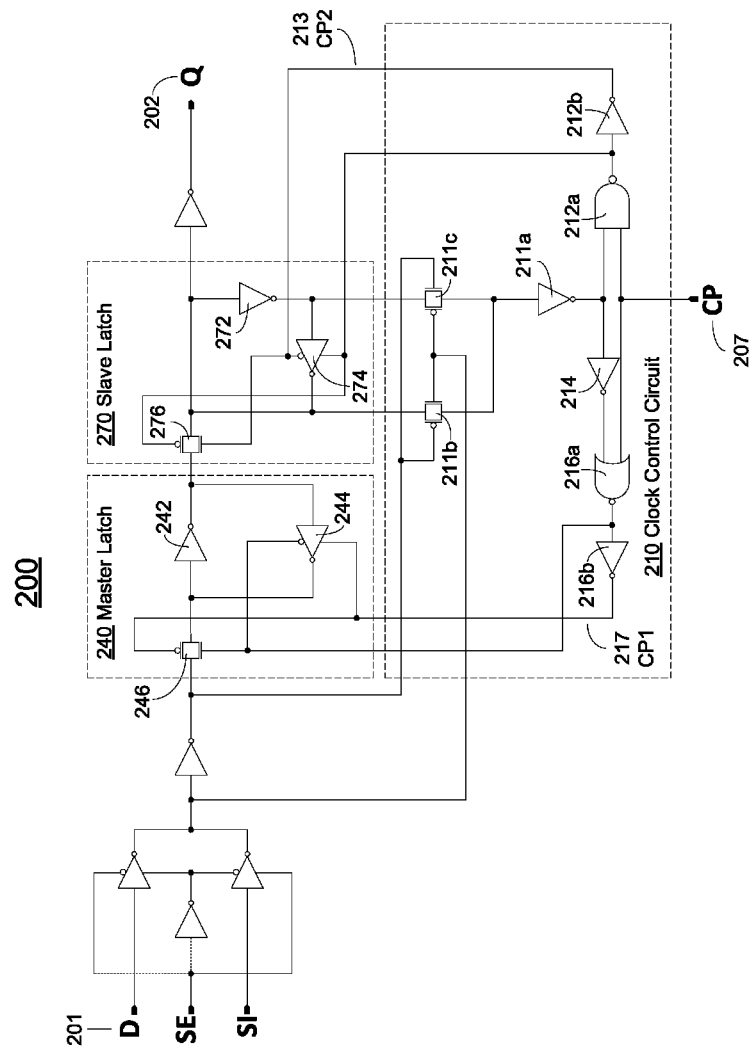
FIG. 2 illustrates an exemplary schematic diagram of a low clocking power flip-flop electronic circuit, in accordance with embodiments of the present invention.

FIG. 2 illustrates an exemplary schematic diagram of a low clocking power flip-flop electronic circuit 200, in accordance with embodiments of the present invention. Low clocking power flip-flop electronic circuit 200 comprises two conventional latches, master latch 240 and slave latch 270. In this exemplary embodiment, master latch 240 and slave latch 270 are D-Q type latches, although that is not required. Embodiments in accordance with the present invention are well suited to a variety of latch types. Low clocking power flip-flop electronic circuit 200 additionally comprises an optional scan multiplexor. Responsive to a scan enable input SE, the scan multiplexor selects between a scan input SI or a data input D 201.

Low clocking power flip-flop electronic circuit 200 further comprises an internal clock control circuit 210. Clock control circuit 210 determines if the flip-flop electronic circuit 200 is active, by comparing the input to the master latch 240 with the output of the slave latch 270. The flip-flop 200 is active when the input to the master latch 240 equals the output of the slave latch 270. If the flip-flop electronic circuit 200 is active, clock control circuit 210 allows the clock signal CP 207 to propagate to the master latch 240 and to the slave latch 270, enabling "nominal" operation of the flip-flop electronic circuit 200. However, if the flip-flop electronic circuit 200 is inactive, clock control circuit 210 blocks the clock signal CP 207 from the master latch 240 and from the slave latch 270. When the clock signal CP 207 is blocked, the flip-flop electronic circuit 200 does not change state. The clock signal CP 207 is blocked when the flip-flop electronic circuit 200 does not need to change state.

It is to be appreciated that clock control circuit 210 is internal to low clocking power flip-flop electronic circuit 200. For example, clock control circuit 210 accepts inputs only from low clocking power flip-flop electronic circuit 200, and controls clock signals only to low clocking power flip-flop electronic circuit 200. Additionally, clock control circuit 210 does not accept input from, nor provide control to, devices outside of low clocking power flip-flop electronic circuit 200.

Clock control circuit 110 implements the following logic expressions:

For the master latch, 217 CP1=($D_{201}$ XNOR $Q_{202}$)
OR CP 207     (Relation 1)

For the slave latch, 213 CP2=($D_{201}$ XOR $Q_{202}$)
AND CP 207     (Relation 2)

Master Latch 240 comprises cross-coupled inverters 242 and tri-state inverter 244, and pass gate 246. Slave Latch 250 comprises cross-coupled inverters 272 and tri-state inverter 274, and pass gate 276. The output of master latch 240 is coupled to the input of slave latch 270. Clock control circuit 210 comprises inverter 211a and pass gates 211b and 211c. In this configuration, gates 211a, 211b and 211c implement an XOR logic function. Clock control circuit 210 also comprises NAND gate 212a and inverter 212b. In this configuration, gates 212a and 212b implement an AND logic function. Clock control circuit 210 further comprises NOR gate 216*a* and an inverter 216*b*. In this configuration, gates 216*a* and 216*b* implement an OR logic function. Clock control circuit 210 additionally comprises inverter 214. Clock control circuit 210 implements the logic functions described in Relation 1 and Relation 2, above.

Under the conventional art, a clock signal is always applied to about 16 devices of a conventional master-slave flip-flop. For example, for a conventional flip-flop corresponding to master latch 240 and slave latch 270, a clock signal is always applied to four devices, e.g., FET gates, each of logic gates 244 and 274 and pass gates 246 and 276. It is to be appreciated that these 16 clocking inputs consume active clocking power on every clock transition, even when the flip-flop is quiescent.

In contrast, in accordance with embodiments of the present invention, the CP 207 signal is applied to only four devices, e.g., one input each of gates 212*a* and 216*a*, when low clocking power flip-flop electronic circuit 200 is quiescent or inactive. Accordingly, in accordance with embodiments of the present invention, a clock signal is applied to only 4 devices instead of about 16 devices under the conventional art, when a flip-flop circuit is inactive.

Since a flip-flop circuit may typically be inactive for 90 percent or more of clock cycles, embodiments in accordance with the present invention save appreciable active clocking power, in comparison with the conventional art.

Embodiments in accordance with the present invention provide systems and methods for low clocking power flip-flops. In addition, embodiments in accordance with the present invention provide systems and methods for low clocking power flip-flops that block a clock signal to a flip-flop's latches during periods of inactivity. Further, embodiments in accordance with the present invention provide systems and methods for low clocking power flip-flops that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the following claims.

What is claimed is:

1. A flip-flop electronic circuit comprising:
  a master latch coupled to a slave latch in a flip-flop configuration; and
  a clock control circuit for comparing an input to said master latch with an output of said slave latch, and responsive to said comparing, said master latch and said slave latch are configured to retain their respective states when said flip-flop electronic circuit is in a quiescent condition.

2. The flip-flop electronic circuit of claim 1 wherein only devices of said clock control circuit receive said clock signal in said quiescent condition.

3. The flip-flop electronic circuit of claim 1 wherein no more than four devices dissipate active clocking power in said quiescent condition.

4. The flip-flop electronic circuit of claim 1 wherein said clock control circuit implements a logic function wherein a clock signal to said master latch is equal to (said input to said master latch XNOR said output of said slave latch) OR said clock signal.

5. The flip-flop electronic circuit of claim 1 wherein said clock control circuit implements a logic function wherein a clock signal to said slave latch is equal to (said input to said master latch XOR said output of said slave latch) AND said clock signal.

6. The flip-flop electronic circuit of claim 1 wherein said clock control circuit comprises no more than three two-input logic gates.

7. The flip-flop electronic circuit of claim 1 wherein said clock control circuit controls said clock signal only for one flip-flop electronic circuit.

8. An electronic circuit comprising:
  a master latch comprising:
  a first pass gate (246) coupled to an input of a first inverter (242);
  a second tri-state inverter (244) coupled to an output of said first inverter (242) and to said input of said first inverter (242),
  wherein said first pass gate and said second tri-state inverter (244) are controlled by a first clock signal (217) and its inverse;
  a slave latch comprising:
  a second pass gate (276) coupled to an input of a third inverter (272);
  a fourth tri-state inverter (274) coupled to an output of said third inverter (272) and to said input of said third inverter (272),
  wherein said second pass gate (276) and said fourth tri-state inverter (274) are controlled by a second clock signal (213) and its inverse;
  wherein said master latch and said slave latch are configured to form a flip-flop electronic circuit; and
  a clock control circuit (210) configured for comparing an input to said master latch and an output of said slave latch, and responsive to said comparing, presenting a quiescent master latch clock signal to said master latch and a quiescent slave latch clock signal to said slave latch.

9. The electronic circuit of claim 8 wherein said master latch clock signal and said slave latch clock signal are quiescent when said flip-flop electronic circuit is inactive.

10. The electronic circuit of claim 8 wherein said clock control circuit is also for responsive to said comparing, presenting an active master latch clock signal to said master latch and an active slave latch clock signal to said slave latch.

11. The electronic circuit of claim 10 wherein said master latch clock signal and slave latch clock signal are active when said flip-flop electronic circuit is active.

12. The electronic circuit of claim 8 wherein said clock control circuit comprises: a third pass gate (211*b*) coupled to an output of said second pass gate (276);
  a fourth pass gate (211*c*) coupled to said output of said third inverter (272);
  a fifth inverter (211*a*) coupled to an output of said fourth pass gate (211*c*);
  a sixth inverter (214) coupled to an output of said fifth inverter (211*a*);
  a NOR gate (216*a*) having a first input coupled to an output of said sixth inverter (214);
  a NAND gate (212*a*) having a first input coupled to output of said fifth inverter (211*a*);
  said NAND gate (212*a*) and said NOR gate (216*a*) having a second input coupled to a master clock signal (207);
  said NOR gate (216*a*) generating said master latch clock signal; and
  said NAND gate (212*a*) generating said slave latch clock signal.

13. The electronic circuit of claim 8 wherein no devices of said master latch and no devices of said slave latch dissipate active clocking power when said flip-flop electronic circuit is inactive.

14. The electronic circuit of claim 8 wherein no more than four devices of said clock control circuit dissipate active clocking power when said flip-flop electronic circuit is inactive.

15. A method comprising:
comparing a data input to a master latch electronic circuit with a data output of a slave latch electronic circuit, wherein said master latch electronic circuit and said slave latch electronic circuit are configured to form a flip-flop electronic circuit; and responsive to said comparing, controlling said master latch electronic circuit and said slave latch electronic circuit to retain their respective states when said flip-flop electronic circuit is in a quiescent condition.

16. The method of claim 15 further comprising:
responsive to said comparing, passing a clock signal to said master latch electronic circuit and said slave latch electronic circuit when said flip-flop electronic circuit is in an active condition.

17. The method of claim 15 further comprising:
generating a master latch clock signal to control said master latch, wherein said master latch clock signal is determined by the logical expression (said data input XNOR said data output) OR a master clock signal.

18. The method of claim 15 further comprising:
generating a slave latch clock signal to control said slave latch, wherein said slave latch clock signal is determined by the logical expression (said data input XOR said data output) AND a master clock signal.

19. The method of claim 15 wherein said data input and said data output are obtained exclusively from within said flip-flop electronic circuit.

20. The method of claim 15 wherein said clock signal is free running within said flip-flop electronic circuit.

* * * * *